(12) United States Patent
Andersen et al.

(10) Patent No.: US 11,982,294 B2
(45) Date of Patent: May 14, 2024

(54) SYSTEM AND METHOD FOR REPLACING A FAN IN AN ENERGIZED STATE

(71) Applicant: SCHNEIDER ELECTRIC IT CORPORATION, Foxboro, MA (US)

(72) Inventors: Claus Aabjerg Andersen, Kolding (DK); Jean-Paul Gonnet, Grenoble (FR)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/879,296

(22) Filed: Aug. 2, 2022

(65) Prior Publication Data
US 2024/0044343 A1    Feb. 8, 2024

(51) Int. Cl.
*F04D 29/64* (2006.01)
*F04D 19/00* (2006.01)
*F04D 29/52* (2006.01)
*F04D 29/70* (2006.01)

(52) U.S. Cl.
CPC ......... *F04D 29/646* (2013.01); *F04D 19/002* (2013.01); *F04D 29/522* (2013.01); *F04D 29/703* (2013.01)

(58) Field of Classification Search
CPC .... F04D 29/646; F04D 19/002; F04D 29/522; F04D 29/703; H05K 1/0201; H05K 7/20; H05K 1/02; H05K 7/202; H05K 7/20172; H05K 7/20709; H05K 7/20536; H05K 13/0486; H05K 2203/176; G06F 1/20
See application file for complete search history.

(56) References Cited

U.S. PATENT DOCUMENTS

| | | | |
|---|---|---|---|
| 7,778,013 B2 | 8/2010 | Bruski et al. |
| 8,256,305 B2 | 9/2012 | Bean, Jr. et al. |
| 11,280,352 B2 | 3/2022 | Zhang |
| 2012/0188713 A1 | 7/2012 | Chen |
| 2015/0116930 A1 | 4/2015 | Yamaguchi et al. |
| 2015/0351280 A1 | 12/2015 | Gonzalez Inda et al. |
| 2022/0231500 A1 | 7/2022 | Andersen et al. |

FOREIGN PATENT DOCUMENTS

TW    201235570 A    9/2012

OTHER PUBLICATIONS

Extended European Search Report from correspondence European Application No. 23188948.6 dated Jan. 29, 2024.

*Primary Examiner* — Aaron R Eastman
(74) *Attorney, Agent, or Firm* — Lando & Anastasi, LLP

(57) ABSTRACT

A fan housing mounting assembly includes an engagement mechanism configured to support a fan module and a housing configured to support the engagement mechanism. The engagement mechanism is pivotally connected to the housing. The assembly further includes a mesh plate including at least one connector coupled to the engagement mechanism. The mesh plate is configured to move with respect to the housing between a first position in which the mesh plate is spaced from the housing and a second position in which the mesh plate is adjacent to the housing. The assembly further includes a spring configured to engage the engagement mechanism. The spring is configured to bias the engagement mechanism to pivot with respect to the housing to present the fan module for removal. When the engagement mechanism is pivoted with respect to the housing, the mesh plate is maintained in the second position.

27 Claims, 10 Drawing Sheets

SYSTEM AND METHOD FOR REPLACING A FAN IN AN ENERGIZED STATE

BACKGROUND OF DISCLOSURE

1. Field of Disclosure

Embodiments of the disclosure relate generally to safety features, and more specifically, to a safety assembly that is used within an equipment rack to mitigate the risk of exposure of person to an arc flash events from connecting and disconnecting electronic equipment from busbars and fan modules within the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power throughout any black out or brown out periods. Further, it is desirable to service the UPS itself without disruption, as well as its constituent parts.

A typical power distribution unit consists of a rack frame chassis and removable power distribution modules or power modules for short, which are often removed for replacement or service. The power modules connect to a live busbar provided at a back of the equipment rack, and when the power module is removed, the live busbar is exposed. Often, the equipment rack includes a warning label to power down the equipment rack when working near the busbar to avoid hazards, such as arc flash, but such a label oftentimes can be ineffective. Other approaches have been tried, such as installing a blanking panel to block access to the live busbar. However, this approach, when implemented, requires additional time and parts. Fan modules are used to cool the electronic equipment housed in the equipment rack.

Often, fan modules are removed and replaced from the equipment rack. Arc flashing can occur during such removal and replacement of such fan modules.

SUMMARY OF DISCLOSURE

One aspect of the present disclosure is directed to a fan housing mounting assembly comprising an engagement mechanism configured to support a fan module and a housing configured to support the engagement mechanism. The engagement mechanism is pivotally connected to the housing. The assembly further comprises a mesh plate including at least one connector coupled to the engagement mechanism. The mesh plate is configured to move with respect to the housing between a first position in which the mesh plate is spaced from the housing and a second position in which the mesh plate is adjacent to the housing. The assembly further comprises a spring configured to engage the engagement mechanism. The spring is configured to bias the engagement mechanism to pivot with respect to the housing to present the fan module for removal. When the engagement mechanism is pivoted with respect to the housing, the mesh plate is maintained in the second position.

Embodiments of the assembly further may include configuring the at least one connector with a plurality of prongs configured to releasably engage the engagement mechanism. The mesh plate may include a first pattern of openings to enable air generated by the fan module to flow through the first pattern of openings. The housing may include a peripheral wall sized to receive the engagement mechanism and a mesh wall connected to the peripheral wall. The mesh wall of the housing may have a second pattern of openings formed therein that are offset from the first pattern of openings of the mesh plate. The mesh plate, when in the second position, may be configured with the mesh wall of the housing to block airflow. The engagement mechanism may include a U-shaped bracket pivotally connected to the housing. The fan module may include a fan module housing. The engagement mechanism may be sized and configured to receive and support the fan module housing of the fan module. The fan module housing may be configured to be releasably secured by a threaded fastener to the engagement mechanism. The mesh plate may be configured to move to the second position during an arc flash incident.

Another aspect of the present disclosure is directed to a method of assembling a fan housing mounting assembly configured to contain energy from arc flash within a mounting slot of an equipment rack. In one embodiment, the method comprises: securing a housing to an enclosure; pivotally securing an engagement mechanism to the housing within the interior of the housing; positioning a fan module in the engagement mechanism; coupling a mesh plate to the engagement mechanism; and positioning a spring to engage the engagement mechanism. The spring is configured to bias the engagement mechanism to pivot with respect to the housing to present the fan module for removal. When the engagement mechanism is pivoted with respect to the housing, the mesh plate is maintained in the second position.

Embodiments of the method further may include configuring the mesh plate with a plurality of prongs to releasably engage the engagement mechanism. The mesh plate may include a first pattern of openings to enable air generated by the fan module to flow through the first pattern of openings. The housing may include a peripheral wall sized to receive the engagement mechanism and a mesh wall connected to the peripheral wall. The mesh wall of the housing may have a second pattern of openings formed therein that are offset from the first pattern of openings of the mesh plate. The mesh plate, when in the second position, may be configured with the mesh wall of the housing to block airflow. The engagement mechanism may include a U-shaped bracket pivotally connected to the housing. The fan module may include a fan module housing. The engagement mechanism may be sized and configured to receive and support the fan module housing of the fan module. The mesh plate may be configured to move to the second position during an arc flash incident.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings.

DETAILED DESCRIPTION

Figure 1:
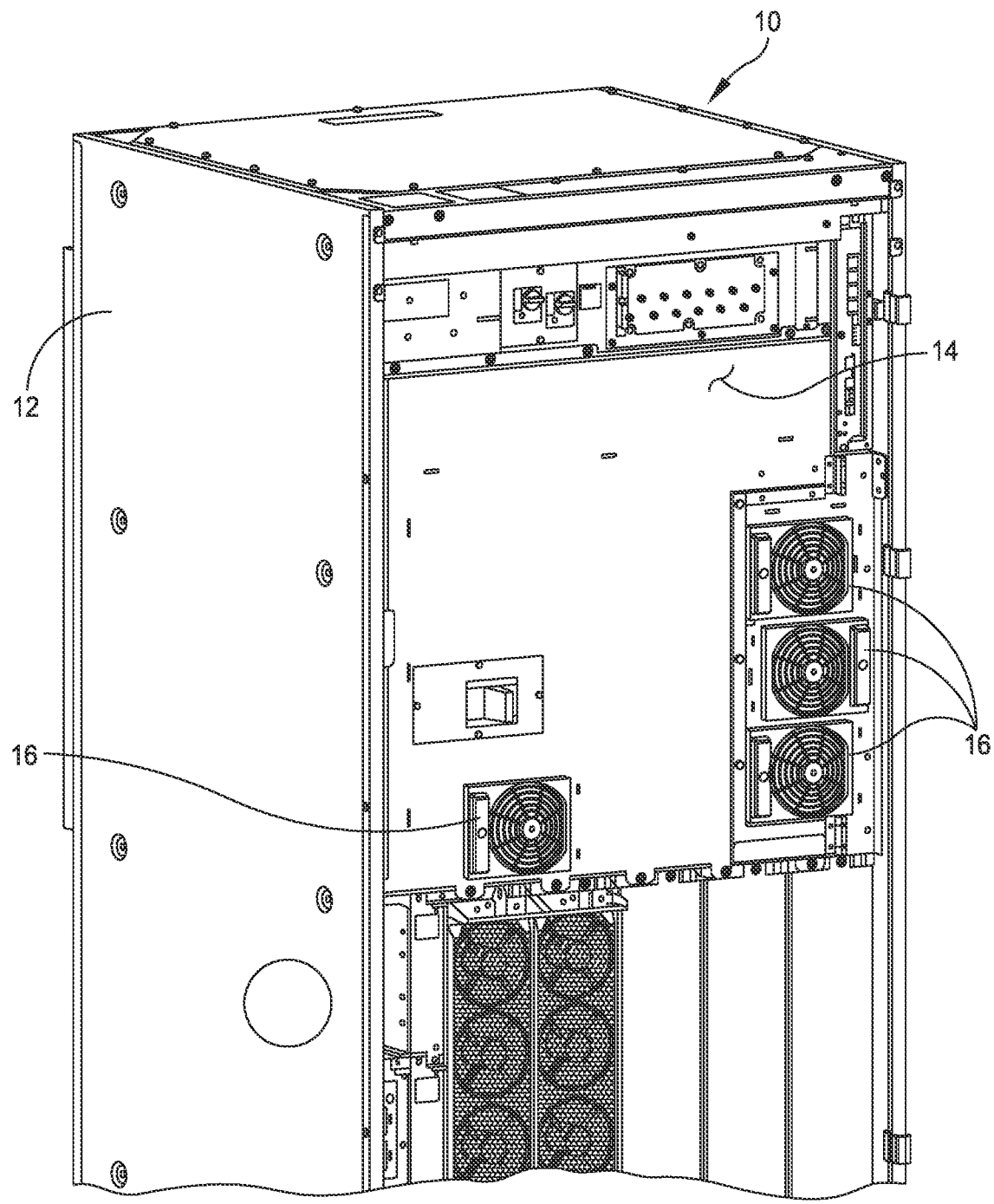
FIG. 1 is a perspective view of a portion of an equipment rack having several fan modules to move air within the equipment rack.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Mission-critical applications such as data centers, hospitals, airports, and military require high-availability power supply. One means of improving power availability is through modular design, which reduces mean time to recover (MTTR). For example, replacing a failed module in a UPS decreases recovery time while eliminating the downtime risk of transferring to bypass. This practice involves the ability to replace modules in any mode of operation. In addition to UPS, other low-voltage electrical equipment offered can be removed and replaced, such as cooling modules (e.g., fan modules), tap units on energized busway and circuit breaker modules on energized switchboard.

During such replacements, arc flash can occur. Specifically, energized-swapping activities can pose electrical hazards, such as shock and arc flash, to operators performing such replacements. A shock hazard may occur when the operator approaches energized electric conductors or circuit parts. The operator may inadvertently touch the part, i.e., due to disturbances, stumbling, or when in close proximity to de-energized parts. An arc flash may result when a fault occurs between two live conductors. Sources of an arc flash can be foreign elements, such as tools or dust/debris, defect or worn-down insulation material, poor design, poor installation, to name a few. Arc flash can be measured based on incident energy released through the air in the form of heat, sound, light, and explosive pressure, all of which can cause harm. Some specific injuries can include burns, blindness, electric shock, hearing loss, and fractures.

The present disclosure is directed to a fan housing mounting assembly that enables the operator to safely remove and install a new fan module within the equipment rack.

Referring to FIG. 1, a portion of an equipment rack, generally indicated at 10, is shown. In one embodiment, the equipment 10 rack includes a chassis, or frame structure 12 that defines an enclosure. Although not shown, the equipment rack 10 includes an open front which may or may not have a door to enclose the equipment rack. The open front has several mounting slots that are each configured to slidably receive electronic components, such as power modules. Once installed, the power modules engage a busbar provided at a back of the chassis in the well-known manner to provide power to the power modules. In place of the busbar, the chassis of the rack enclosure may include live wire provided to power equipment housed within the equipment rack, including the power modules.

As shown, the back of the equipment rack 10 includes a panel 14 and several fan modules, each indicated at 16, secured to the panel. Although four fan modules 16 are shown, it should be understood that any number of fan modules can be provided at desired locations on the panel 14 of the equipment rack 10 to provide cooling inside the equipment rack. Each fan module 16 includes a fan module housing, a motor supported by the fan module housing, and a fan rotatably coupled to the motor by a fan shaft. The fan module 16 is secured to the panel 14 of the equipment rack 10 so that the fan module extends within its respective opening formed in the panel of the equipment rack. The manner in which the fan modules 16 are secured to the panel 14 of the equipment rack 10 will be described in greater detail below.

Figure 2:
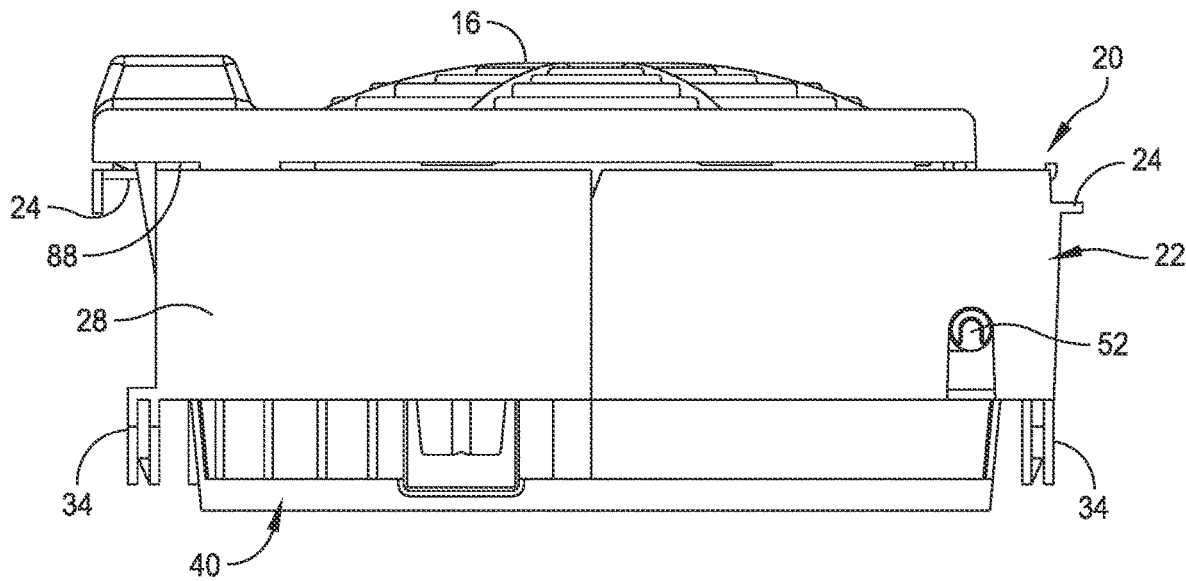
FIG. 2 is a side view of a fan housing mounting assembly of an embodiment of the present disclosure.

Referring to FIG. 2, the fan module 16 is secured to a fan housing mounting assembly, generally indicated at 20, which is secured to the panel 14 of the equipment rack 10. As shown, the fan mounting housing assembly 20 includes a housing, generally indicated at 22, which is rectangular in construction and sized to fit within the opening in the panel 14 of the equipment rack 10. The size and shape of the housing 22 can be configured based on the size and shape of the fan module 16 supported by the housing. For example, although a rectangular housing 22 is illustrated throughout the drawings, the housing can embody a square-shape to accommodate a square-shape fan module. Other shapes and sizes can be provided. As will be described in greater detail below, the housing 22 includes a number of tabs 24 that are provided to secure the housing to a flange 26 the fan module housing of the fan module and to the panel 14 of the equipment rack 10.

Figure 3:
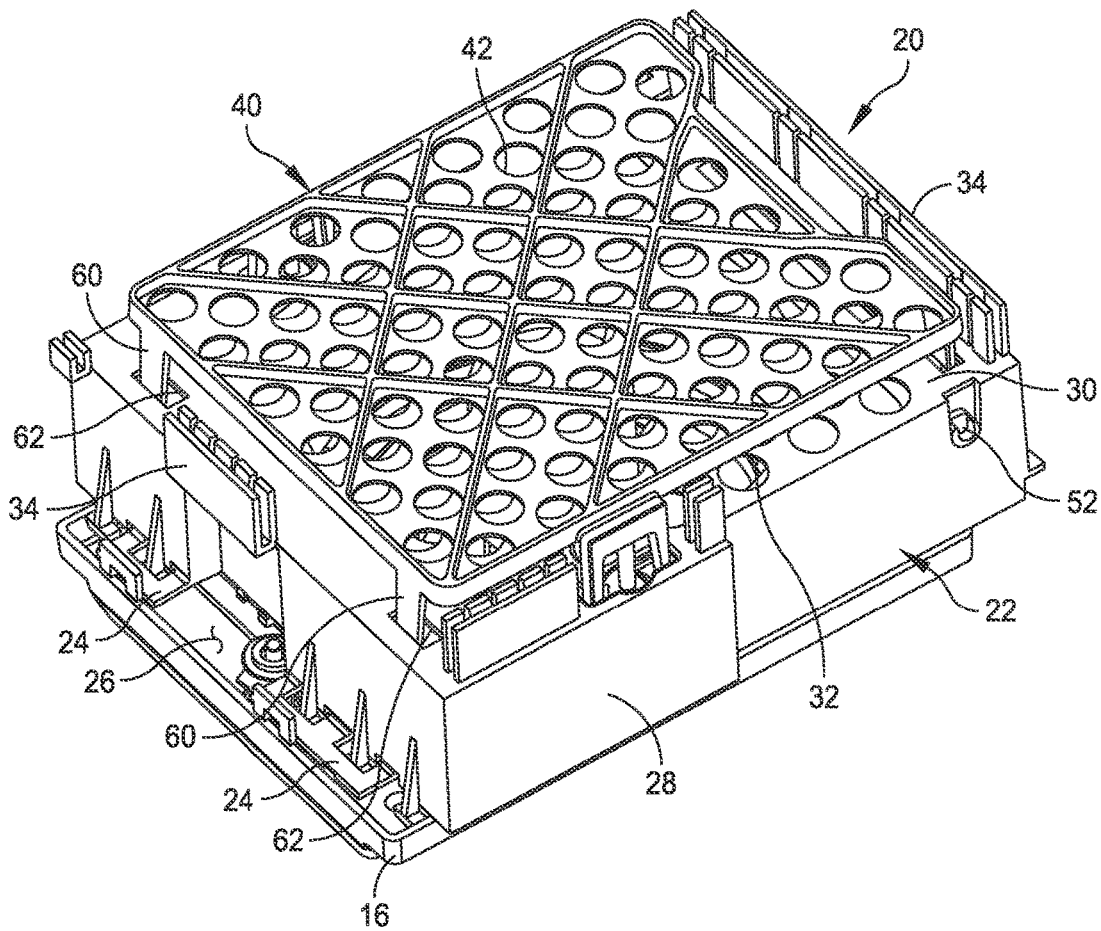
FIG. 3 is a back perspective view of the fan housing mounting assembly.

Referring to FIG. 3, the housing 22 of the fan housing mounting assembly 20 includes a peripheral wall 28 and a mesh wall 30 that is formed with the peripheral wall. The peripheral wall 28 and the mesh wall 30 together define a compartment that is sized to receive the fan module 16 when installing the fan module to the fan housing mounting assembly 20. In the shown embodiment, the mesh wall 30 of the housing 22 has a pattern of openings 32 formed therein. In one embodiment, each opening of the pattern of openings 32 of the housing 22 is circular and the number of openings is 72. It should be understood that the shape and number of openings can be modified to increase or decrease airflow through the fan housing mounting assembly 10. The tabs 24 of the housing 22 extend outwardly from the peripheral wall 28 along an edge of the peripheral wall that is opposite from the mesh wall 30. The housing 22 further includes several guides, each indicated at 34, which are direct A provided to releasably secure a guide or shield to direct air from the fan module to areas within the equipment rack. As shown, the guides 34 extend from the mesh wall 30 along the edges of the mesh wall, with each guide defining a slot that is sized to receive a side wall of the guide or shield therein.

Still referring to FIG. 3, the fan housing mounting assembly 20 further includes a mesh plate, generally indicated at 40, which is coupled to the housing 22. As shown, the mesh plate 40 includes a wall or panel having a pattern of openings 42 formed therein to enable air generated by the fan module 16 to flow through the mesh plate. The wall or panel can be strengthened by reinforcement ribs. In the shown embodiment, the pattern of openings 32 of the mesh wall 30 of the housing 22 are offset from the pattern of openings 42 of the mesh plate 40. As with the pattern of openings 32 associated with the mesh wall 30 of the housing 22, each opening of the pattern of openings 42 associated with the mesh plate 40 is circular and the number of openings is 72. The shape and number of openings can be modified to increase or decrease airflow through the fan housing mounting assembly 10.

Figure 4:
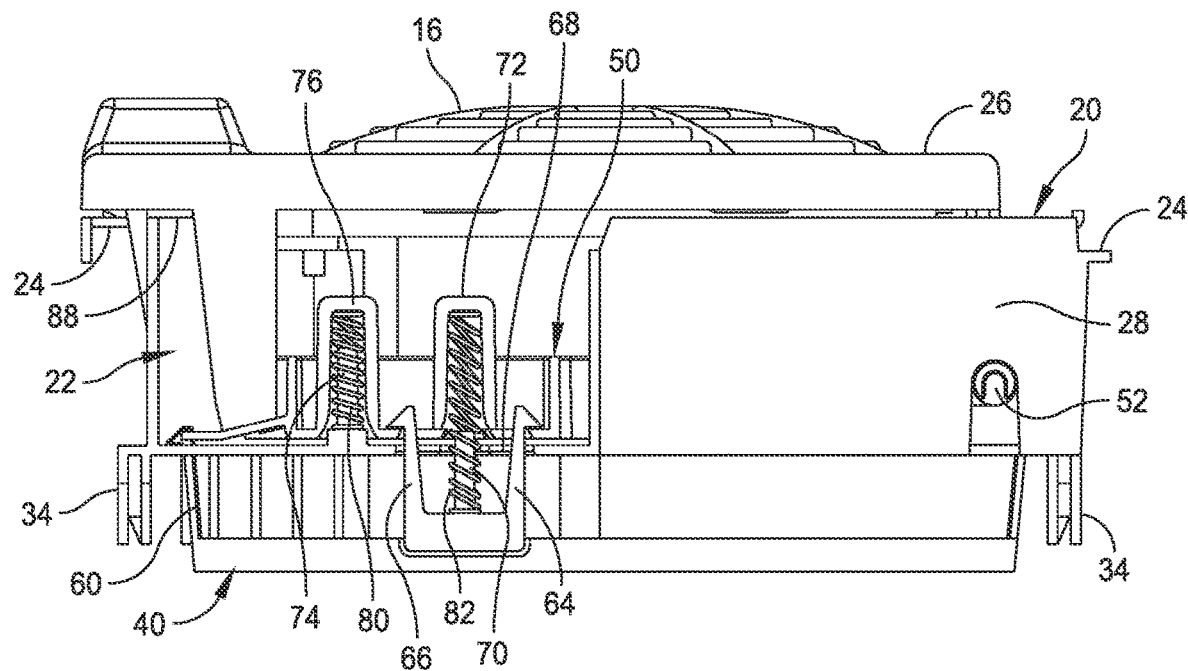
FIG. 4 is a side view of the fan housing mounting assembly with portions removed to reveal components of the assembly, a mesh plate of the assembly being shown in a first position in which the mesh plate is spaced from a housing of the assembly.

Referring to FIG. 4, the fan housing mounting assembly 20 further includes an engagement mechanism, generally indicated at 50. The engagement mechanism 50 is provided to support the fan module 16. As shown, the engagement mechanism 50 is pivotally connected at 52 to the housing 22 to enable the engagement mechanism to pivot with respect to the housing. Specifically, as will be shown and described in greater detail below, the engagement mechanism 50 normally rests within the housing 22 so that the flange 26 of the fan module 16 is flush with the peripheral wall 28 of the housing. The engagement mechanism 50 is configured to pivot with respect to the housing 22 to present the fan module 16 for removal and replacement.

Referring back to FIG. 3, each corner of the mesh plate 40 includes a connector element 60 configured to enter respective openings 62 of the mesh wall 30 of the housing 22. Each connector element 60 is flexible and includes a feature at an end of the connector element to retain the mesh plate 40 to the housing 22 (FIG. 4). The mesh plate 40 is released from the housing 22 by moving the connector elements 60 inwardly with respect to an outer edge of the mesh wall 30 of the housing to release the features of the connector elements from the mesh wall of the housing. Further, each side of the mesh plate 40, e.g., the long side of the mesh plate shown in FIG. 3, includes a pair of connectors or prongs 64, 66 that are provided to couple the mesh plate to the engagement mechanism 50. As shown, the connectors 64, 66 extend through an opening 68 of the mesh wall 30 of the housing 22 and extend within the interior of the housing. Each connector 64, 66 includes a feature at the end of the connector to retain the connector to the engagement mechanism 50 (FIG. 4). The purpose of the connectors 64, 66 is to retain the engagement mechanism 50 within the housing 22 and to prevent the engagement mechanism from pivoting with respect to the housing.

Figure 5:
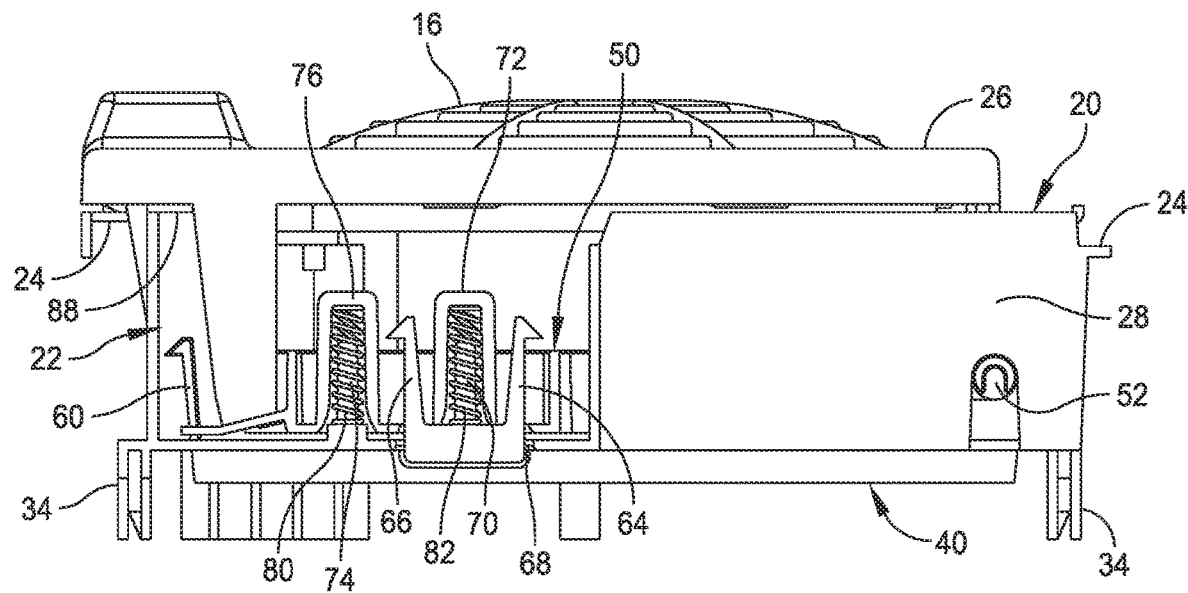
FIG. 5 is a side view of the fan housing mounting assembly with portions removed to reveal components of the assembly, the mesh plate of the assembly being shown in a second position in which the mesh plate is adjacent to the housing.

The mesh plate 40 further includes an alignment pin 70 that is disposed between the connectors 64, 66 and extends in the same direction as the connectors. The alignment pin 70 is configured to enter the opening 68 and a first receptacle 72 associated with the engagement mechanism 50. Similarly, the housing 22 includes an alignment pin 74 that is configured to enter a second receptacle 76 associated with the engagement mechanism 50. Referring additionally to FIG. 5, the fan housing mounting assembly 20 further includes a first spring 80 positioned between the housing 22 and the engagement mechanism 50. Specifically, one end of the first spring 80 is positioned on the alignment pin 74 of the housing and the opposite end of the spring is positioned within the second receptacle 76 of the engagement mechanism 50.

Optionally, a second spring 82 can be positioned between the mesh plate 40 and the engagement mechanism 50. Specifically, one end of the second spring 82 is positioned on the alignment pin 70 of the mesh plate 40 and the opposite end of the spring is positioned within the first receptacle 72 of the engagement mechanism 50. The arrangement is such that the mesh plate 40 is configured to move with respect to the housing 22 between a first position in which the mesh plate is spaced from the housing (FIG. 4) and a second position in which the mesh plate is adjacent to the housing (FIG. 5). As shown, the mesh plate 40 is co-planar with the mesh wall 30 of the housing 22. The second spring 82 is provided to bias the mesh plate 40 to the first position while the connectors 64, 66 of the mesh plate retain the engagement mechanism 50 within the housing 22. As will be discussed below, the first spring 80 is provided to pivot or tilt the engagement mechanism 50.

Figure 6:
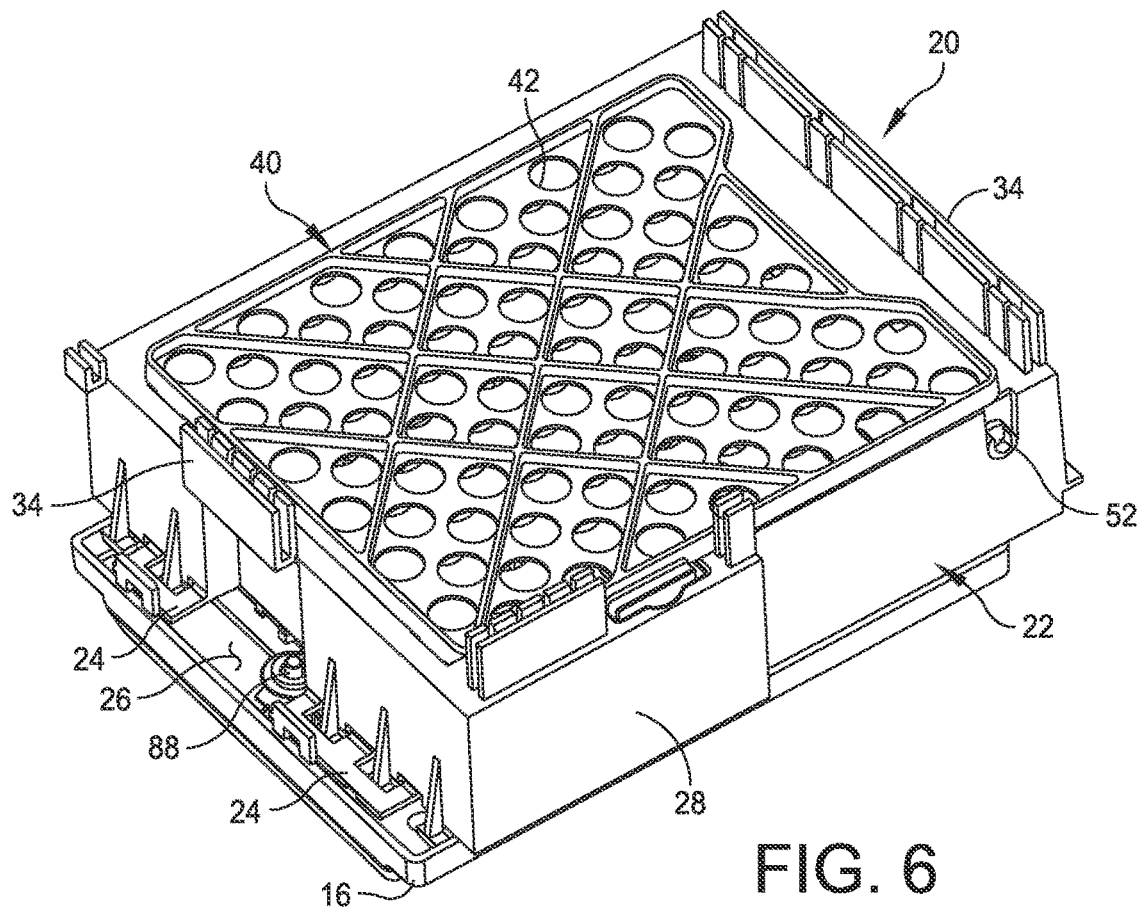
FIG. 6 is a back perspective view of the fan housing mounting assembly shown in FIG. 5.

Referring to FIG. 6, when the mesh plate 40 is in the second position, the mesh plate is configured with the mesh wall 30 of the housing 22 to block airflow since the pattern of openings 42 of the mesh plate are offset from the pattern of openings 32 of the mesh wall of the housing. Specifically, the pattern of openings 32 provided in the mesh wall 30 of the housing 22 is blocked by the mesh plate 40. The movement of the mesh plate 40 to the second position prevents airflow between the fan module 16 and the interior of the equipment rack 10. Further, with the mesh plate 40 in the second position, an operator installing or removing the fan module 16 is protected from arc flash should an arc flash incident occur.

Figure 7:
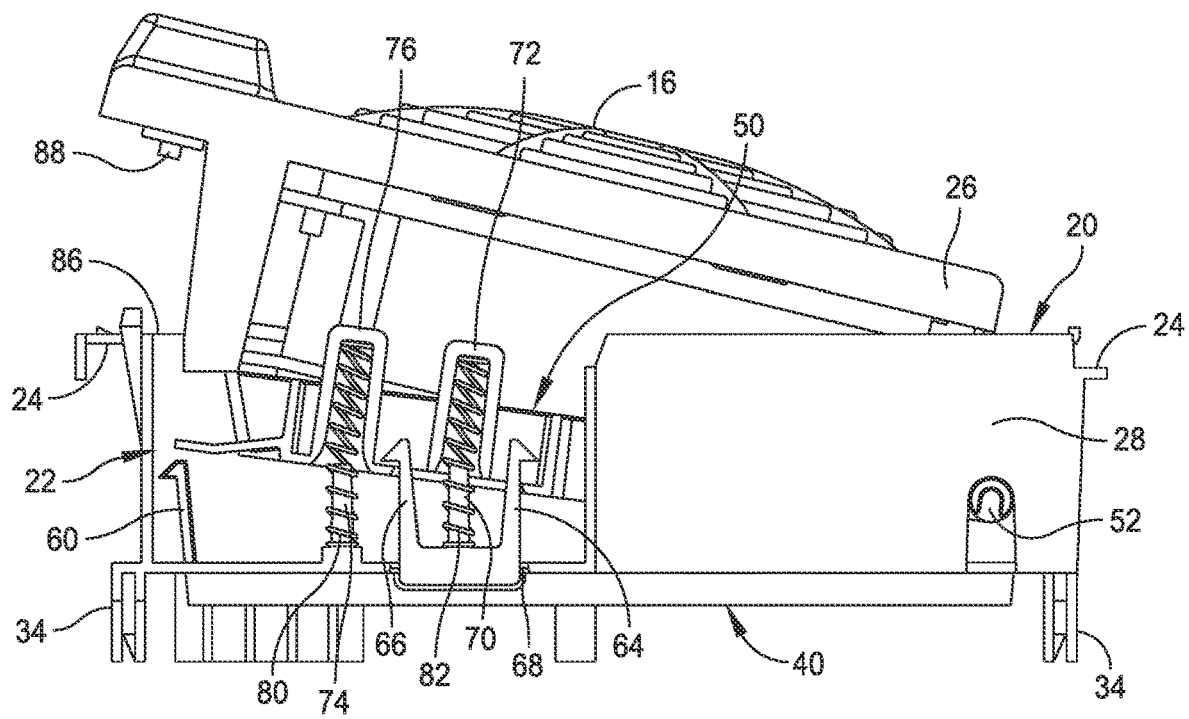
FIGS. 7 and 8 are side views of the fan housing mounting assembly with portions removed to reveal components of the assembly, a spring of the assembly being configured to bias an engagement mechanism of the assembly to pivot with respect to the housing to present a fan module for removal.
Figure 8:
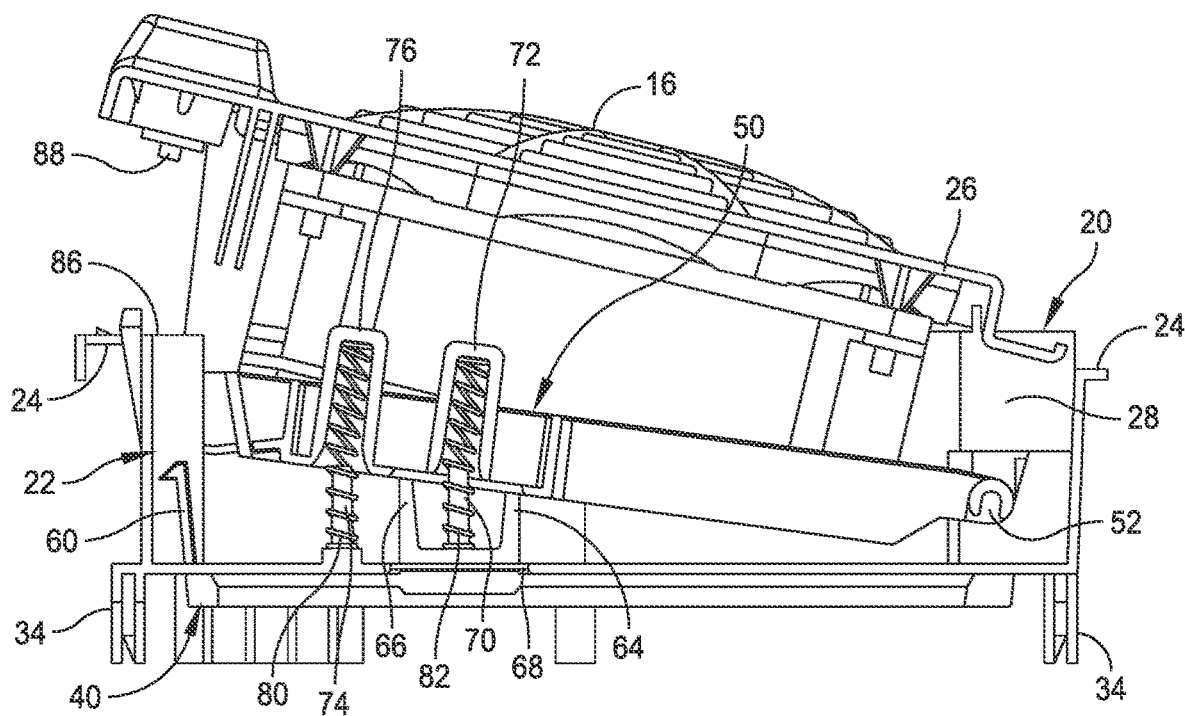
Figure 9:
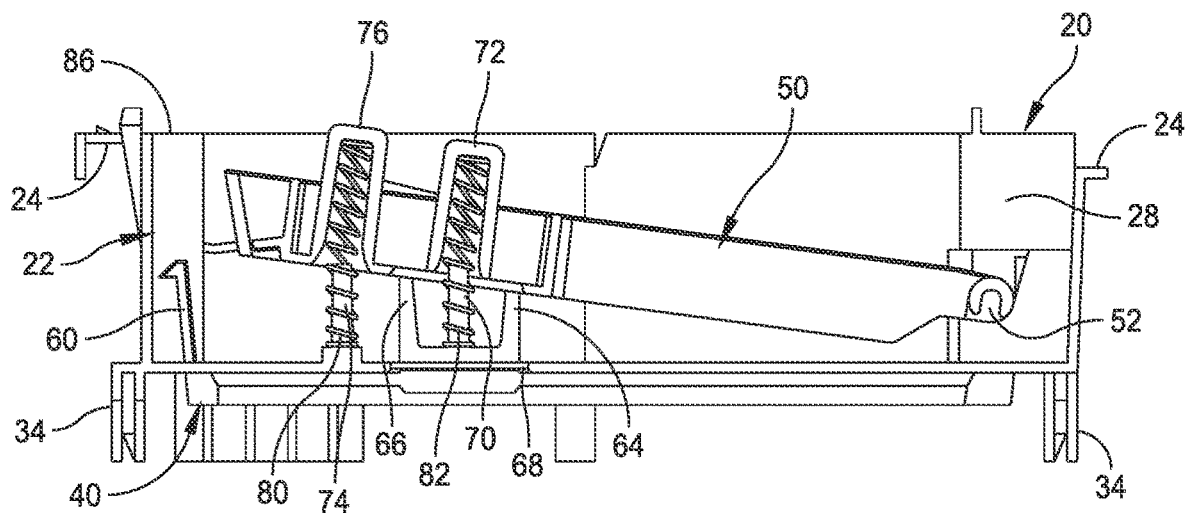
FIG. 9 is a side view of the fan housing mounting assembly with the fan module removed from the engagement mechanism.

Referring to FIGS. 7 and 8, the engagement mechanism 50 further includes a threaded receptacle 86 configured to receive a threaded fastener 88 to releasably secure a fan module housing of the fan module 16. The threaded fastener 88 can be a screw or bolt that is threadably received within the threaded receptacle 86. To remove the fan module 16 from the fan housing mounting assembly 20, the threaded fastener 88 must be removed from the threaded receptacle 86. Once removed, the first spring 80 disposed between the housing 22 and the engagement mechanism 50 biases the engagement mechanism to pivot about its pivot connection 52 with the housing. As shown, the fan module 16 is tilted with respect to the housing 22 to enable an operator to remove the existing fan module and to install a new or replacement fan module. FIG. 9 illustrates the fan module 16 removed from the fan housing mounting assembly 10.

Figure 10:
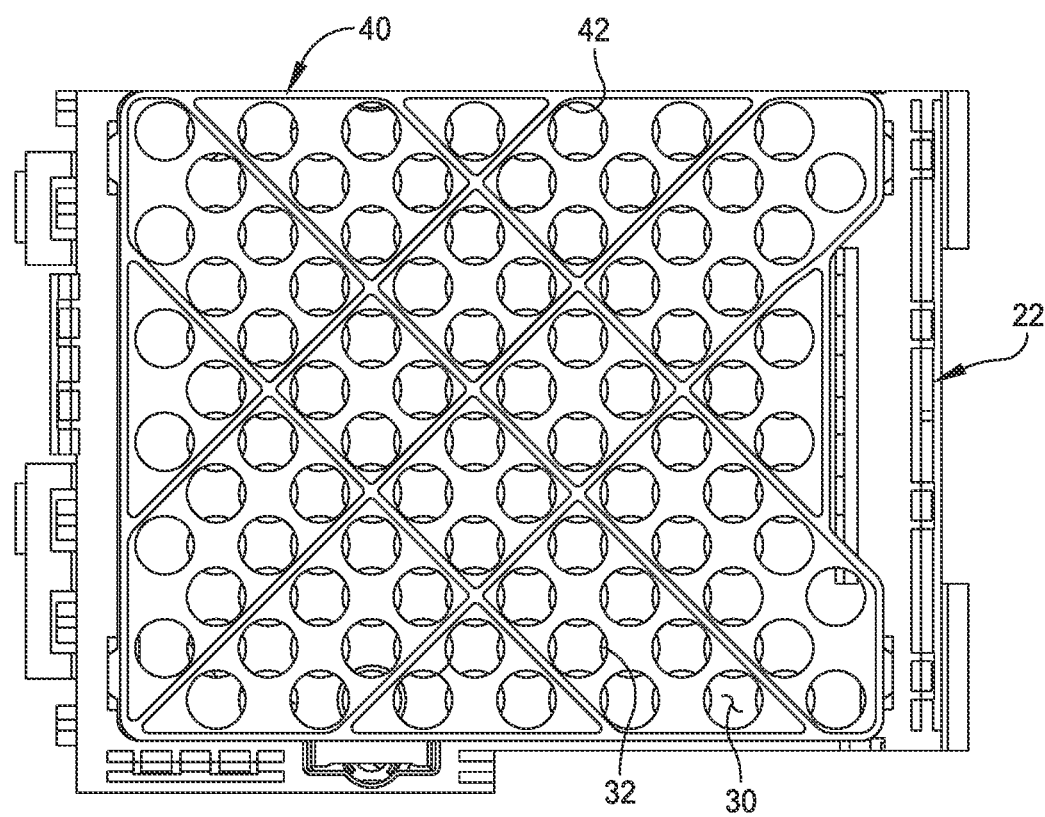
FIG. 10 is a back view of the fan housing mounting assembly.

Referring to FIG. 10, the pattern of openings 42 of the mesh plate 40 are shown to be offset with respect to the pattern of openings 32 of the mesh wall 30 of the housing 22. As shown, there are small openings between the mesh plate 40 and the mesh wall 30 of the housing 22 since the mesh plate does not completely block the pattern of openings 32 of the mesh wall of the housing. Thus, during a pressurized situation caused by an arc flash incident, some of the pressure caused by the arc flash incident is released through the fan housing mounting assembly 10 but not all the pressure so as to cause a dangerous situation for the operator.

Figure 11:
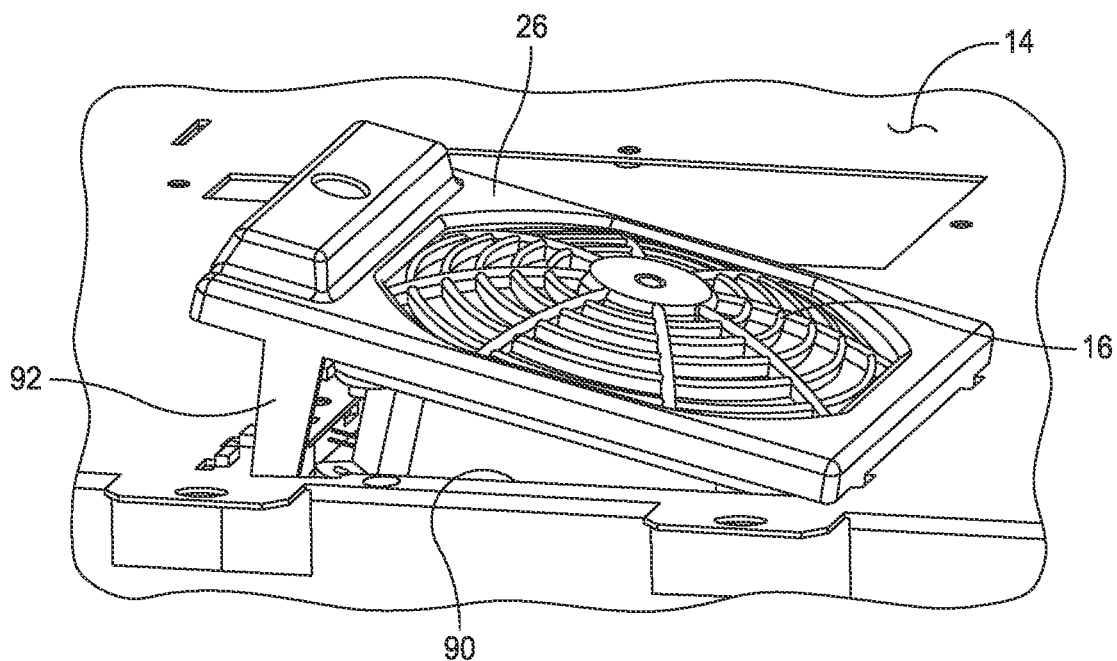
FIG. 11 is a perspective view of the fan module prior to being secured to the fan housing mounting assembly provided in the equipment rack.
Figure 12:
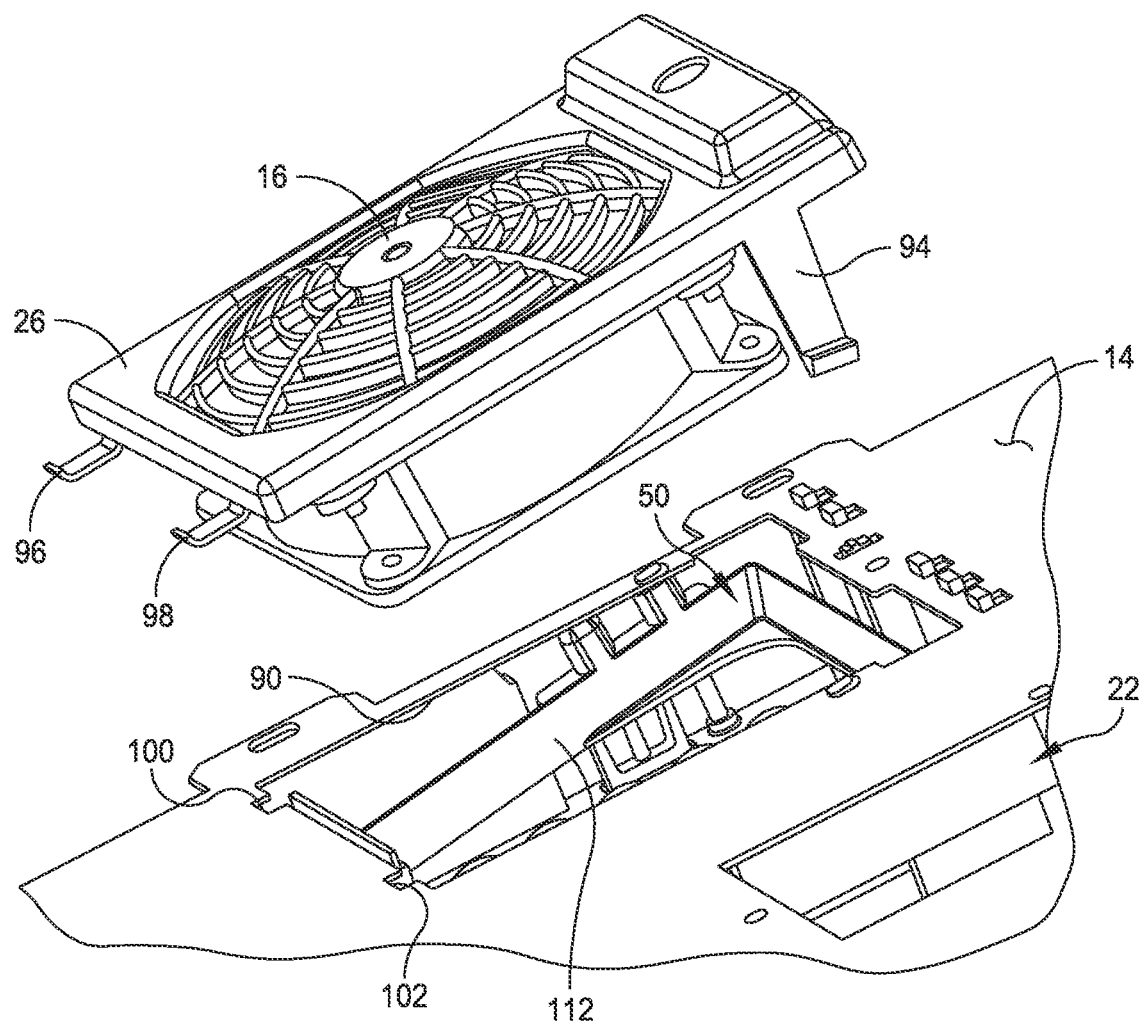
FIG. 12 is a perspective view of the fan module being spaced from the fan housing mounting assembly provided in the equipment rack.

Referring to FIGS. 11 and 12, the manner in which the fan module housing of the fan module 16 is installed on the panel 14 of the equipment rack 10 within an opening 90 formed in the panel is shown. The flange 26 of the fan module 16 has two connectors or prongs 92, 94 that extend downwardly from the flange. The flange 26 of the fan module further has two A the tabs 96, 98 that extend laterally from the flange. The tabs 96, 98 are inserted in respective slots 100, 102 formed in the panel 14 of the equipment rack 10 and the connectors 92, 94 are pressed inwardly to enable tips of the prongs to clear the opening 90 of the panel. To remove the fan module 16, the fan module is pivoted by the engagement mechanism 50 to present the fan module to the operator in the manner shown in FIG. 11. The connectors 92, 94 are pressed inwardly with respect to one another to enable the rotation of the fan module 16. While rotating the fan module 16 with respect to the panel 14, the tabs 96, 98 are removed through the slots 100, 102 to remove the fan module. To install a new or replacement fan module, the tabs 96, 98 of the fan module 16 are received within respective slots 100, 102 of the panel and the fan module is rotated to present the connectors 92, 94 to the opening 90 of the panel. The connectors 92, 94 are pressed inwardly so that the tips of the connectors clear the opening 90 and the fan module 16 can be rotated to fully install the fan module to a position in which the flange 26 is flush with the panel 14 of the equipment rack 10.

Figure 13:
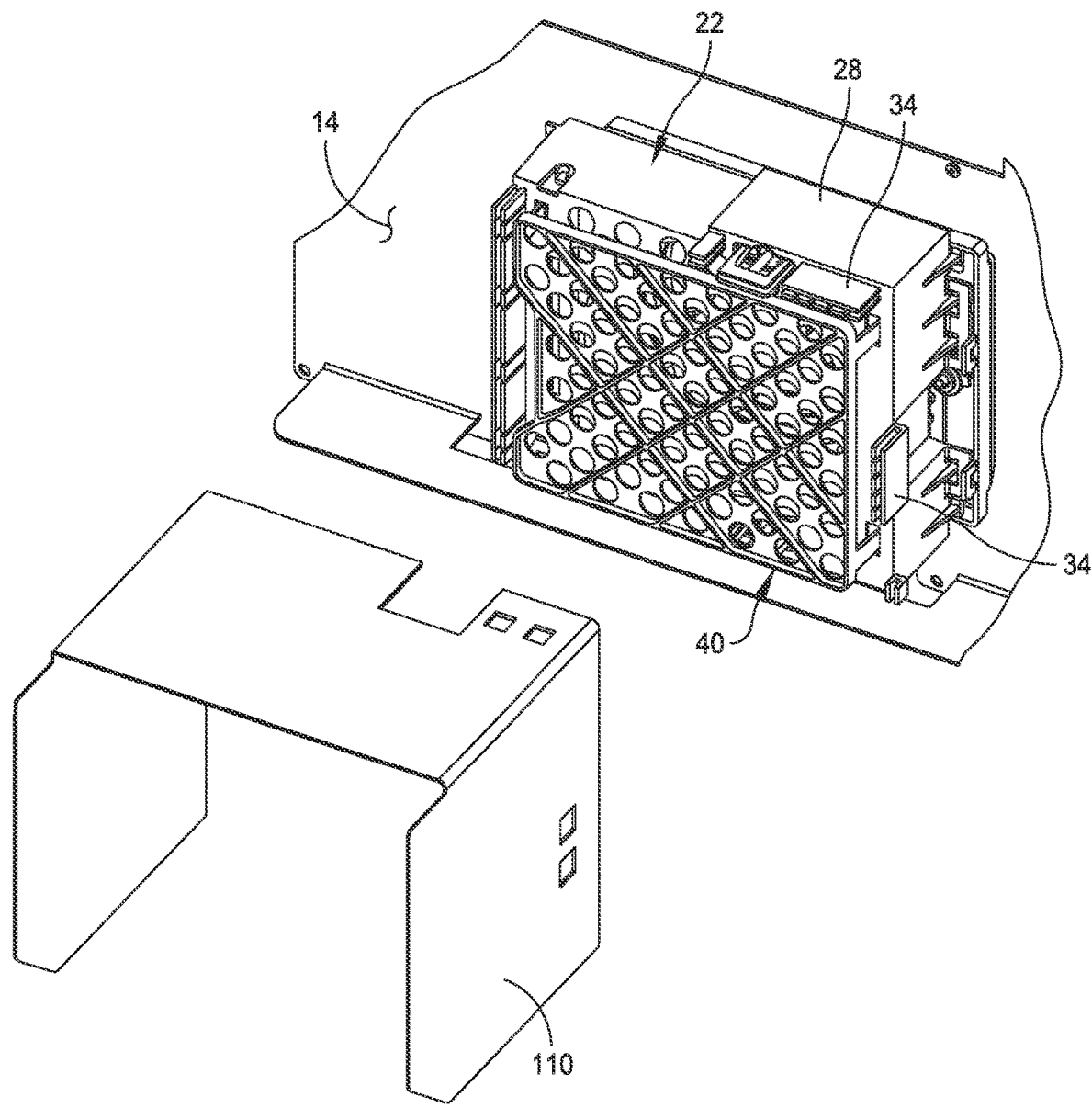
FIG. 13 is a perspective view of a shield used to channel air from the fan housing mounting assembly with the equipment rack.

Referring to FIG. 13, in one embodiment, the fan housing mounting assembly 20 further may include a guide or shield 110 that is secured to the housing 22 to direct or otherwise guide air from the fan module 16 within the interior of the equipment rack 10. As shown, the guide 110 is a three-sided structure having edges that are sized to fit within the guides 34 of the housing 22 of the fan housing mounting assembly 10. FIG. 13 illustrates the guide 110 prior to being installed on the housing 22 of the fan housing mounting assembly 10. Although shown to have three sides, the guide 110 can be configured to include four sides or even one side or two sides.

The constituent parts of the fan housing mounting assembly 10 can be fabricated from any suitable rigid material, such as sheet metal or hard plastic. Such parts include the fan housing 22, the mesh plate 40, the engagement mechanism 50, and the guide 110.

Figure 14:
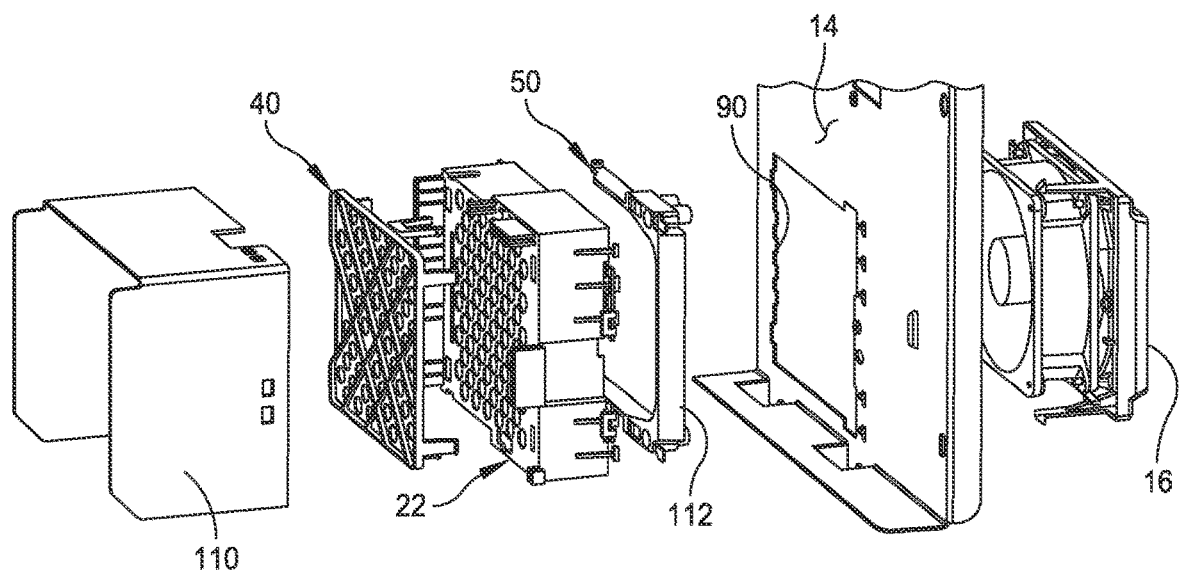
FIGS. 14 and 15 are exploded perspective views of the shield, the fan housing mounting assembly, a portion of the equipment rack and the fan module prior to installation.
Figure 15:
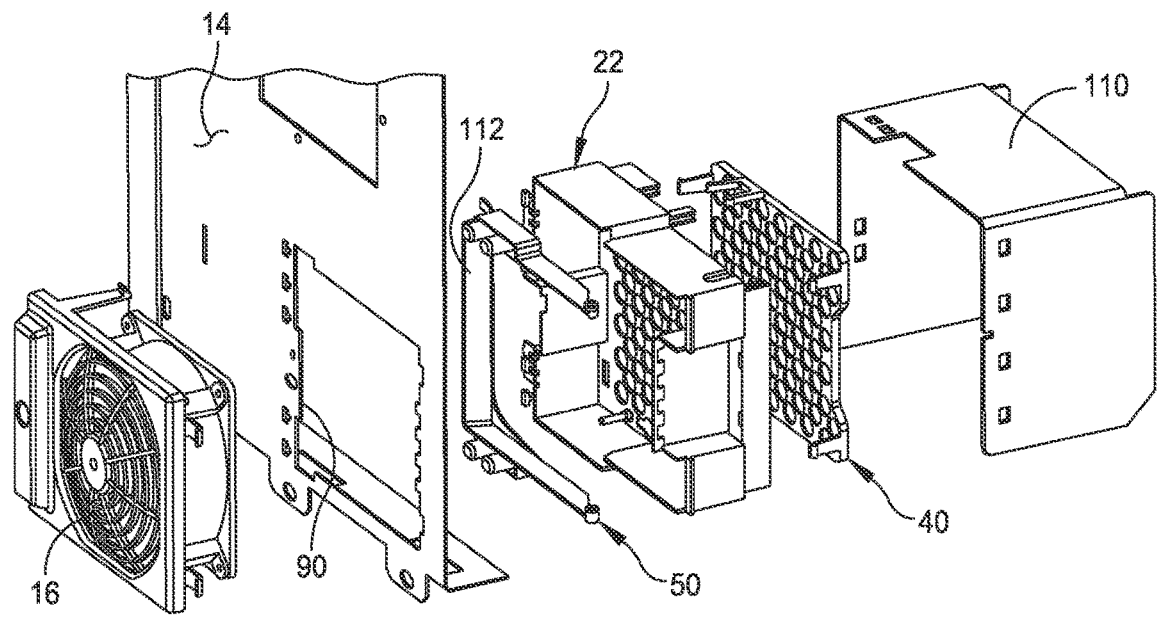

Referring to FIGS. 14 and 15, the fan housing mounting assembly 10 is shown prior to being assembled with one another. As shown, the engagement mechanism 50 includes a U-shaped bracket 112 pivotally connected to the housing 22. The free ends of the U-shaped bracket 112 of the engagement mechanism 50 have the aforementioned pivot connectors 52 to pivotally connect the engagement mechanism to the housing 22. In one embodiment, the fan housing mounting assembly 10 is assembled by pivotally connecting the engagement mechanism 50 to the housing 22. When pivotally connected, the alignment pin 74 of the housing 22 is inserted into the second receptacle 76 of the engagement mechanism 50. The mesh plate 40 is then releasably secured to the housing 22 inserting the connector elements 60 into their respective openings 62 of the mesh wall 30 of the housing 22 and inserting the connectors 64, 66 and the alignment pins 70 into the openings 68 of the mesh wall of the housing. When releasably securing the mesh plate 40, the alignment pin 70 of the mesh plate extends through the opening 68 of the housing and is inserted into the first receptacle 72 of the engagement mechanism 50. Once the housing 22, the mesh plate 40 and the engagement mechanism 50 are assembled, the housing 22 is secured to the panel 14 of the equipment rack 10 within the opening 90 provided in the panel of the equipment rack 10. Once secured, the fan module 16 is inserted into the opening 90 of the panel 14 of the equipment rack 10 in the manner described above, mounted on the engagement mechanism 50 and secured to the engagement mechanism by the threaded fastener 88. Optionally, the guide 110 is secured to the housing 22 via the guides 34 provided on the housing.

Figure 16:
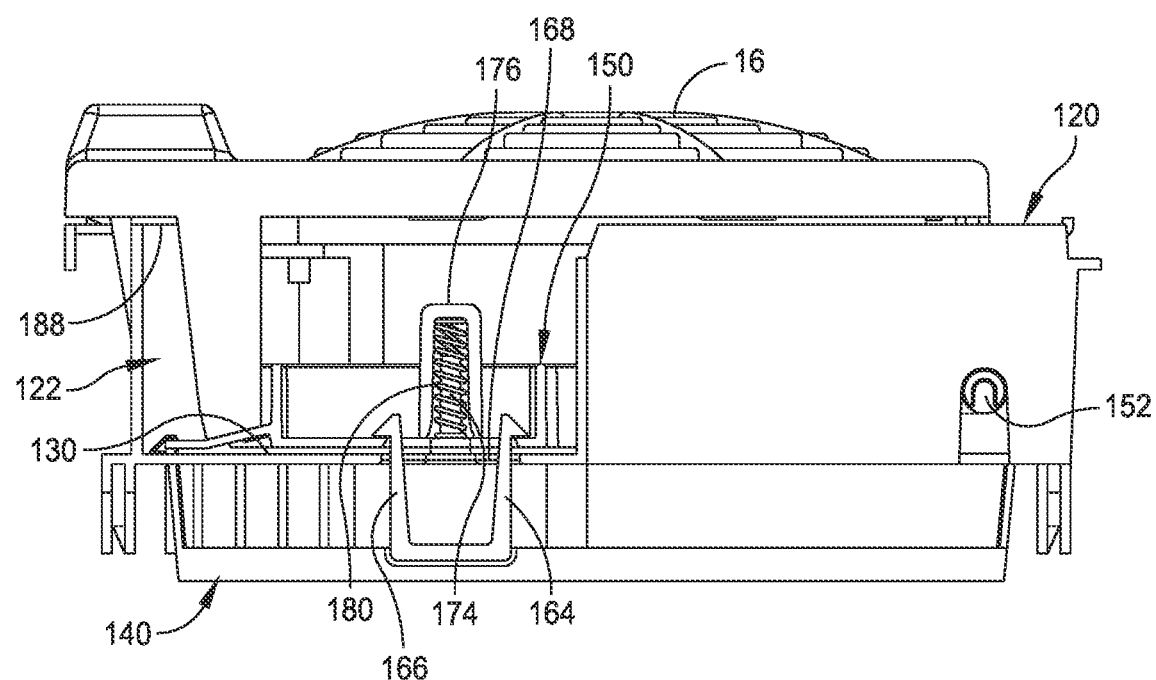
FIG. 16 is a side view of a fan housing mounting assembly of another embodiment of the present disclosure with portions removed to reveal components of the assembly.

Referring to FIG. 16, in an alternative embodiment, a fan housing mounting assembly is generally indicated at 120. The fan housing mounting assembly 120 is substantially identical to the fan housing mounting assembly 20 described above, except for the manner in which the engagement mechanism 50 is pivoted with respect to the housing 22. Specifically, the fan mounting housing assembly 120 includes a housing, generally indicated at 122, a mesh plate, generally indicated at 140, which is coupled to the housing, and an engagement mechanism, generally indicated at 150. As with mesh plate 40 of fan housing mounting assembly 20, the mesh plate 140 includes a pair of connectors or prongs 164, 166 that are provided to couple the mesh plate to the engagement mechanism 150. As shown, the two connectors 164, 166 extend through an opening 168 of the housing 122 to extend within the interior of the housing. It should be noted that the mesh plate 140 does not include an alignment pin.

Instead, the housing 122 of the fan housing mounting assembly 120 includes an alignment pin 174 that is configured to enter a receptacle 176 associated with the engagement mechanism 150. The receptacle 176 is the only receptacle provided in the engagement mechanism 150. As shown, the alignment pin 174 extends along an axis that is coaxial of an axis disposed between the two connectors 164, 166. A spring 180 is positioned between the mesh plate 140 and the engagement mechanism 150. Specifically, one end of the spring 180 engages the mesh plate 140 and surrounds the alignment pin 174 of the housing 122 and the opposite end of the spring is positioned within the receptacle 176 of the engagement mechanism 150. Optionally, one end of the spring 180 engages the housing 122 and the opposite end of the spring is positioned within the receptacle 176. With this embodiment, the force of airflow through the mesh plate 140 maintains the mesh plate in the first position described above.

The operation of the fan housing mounting assembly 120 is substantially similar to the operation of the fan housing mounting assembly 20. The arrangement is such that the mesh plate 140 is configured to move with respect to the housing 122 between a first position in which the mesh plate is spaced from the housing and a second position in which the mesh plate is adjacent to the housing. As referenced above, the airflow generated by the fan module 16 biases the mesh plate 140 to the first position while the connectors 164, 166 of the mesh plate retain the engagement mechanism 150 within the housing 122. When the mesh plate 140 is in the second position, the mesh plate is configured with a mesh wall 130 of the housing 122 to block airflow. To remove the fan module 16 from the fan housing mounting assembly 120, a threaded fastener 188 connecting the fan module to the engagement mechanism 150 must be removed. Once removed, the spring 180 disposed between the mesh plate 140 (or the housing 122) and the engagement mechanism 150 biases the engagement mechanism to pivot about its pivot connection 152 with the housing. As shown, the fan module 16 is tilted with respect to the housing 122 to enable an operator to remove the existing fan module and to install a new or replacement fan module.

In some embodiments, airflow throughput through the meshed hole pattern of the housing and the mesh plate is achieved without undue restriction.

In some embodiments, arc compliance is provided by means of the housing and the mesh plate and can be controlled to a closed position when a fan module is being moved, inserted or is absent.

In some embodiments, the same housing and mesh plate is pushed open by a spring to present the fan module to an operator for removal, and when the when the fan module is fully inserted, the mesh plate is forced open with respect to the housing to promote airflow. At this point arc compliance is ensured by the fan module. Further, in the event of an arc flash incident, the mesh plate is moved toward the mesh wall of the housing by the blast pressure, and while the mesh plate and the mesh wall do not completely eliminate an outburst of hot gasses produced by the arc flash through the assembly, the partial or complete movement of the mesh plate toward the mesh wall assists in reducing the magnitude of any such outburst.

Having thus described several aspects of at least one embodiment of this disclosure, it is to be appreciated various alterations, modifications, and improvements will readily occur to those skilled in the art. Such alterations, modifications, and improvements are intended to be part of this disclosure and are intended to be within the spirit and scope of the disclosure. Accordingly, the foregoing description and drawings are by way of example only.

What is claimed is:

1. A fan housing mounting assembly, comprising:
an engagement mechanism configured to support a fan module;
a housing configured to support the engagement mechanism, the engagement mechanism being pivotally connected to the housing;
a mesh plate including at least one connector coupled to the engagement mechanism, the mesh plate being configured to move with respect to the housing between a first position in which the mesh plate is spaced from the housing and a second position in which the mesh plate is adjacent to the housing; and
a spring configured to engage the engagement mechanism,
wherein the spring is configured to bias the engagement mechanism to pivot with respect to the housing to present the fan module for removal, and
wherein, when the engagement mechanism is pivoted with respect to the housing, the mesh plate is maintained in the second position.

2. The fan housing mounting assembly of claim 1, wherein the at least one connector includes a plurality of prongs configured to releasably engage the engagement mechanism.

3. The fan housing mounting assembly of claim 1, wherein the mesh plate includes a first pattern of openings to enable air generated by the fan module to flow through the first pattern of openings.

4. The fan housing mounting assembly of claim 3, wherein the housing includes a peripheral wall sized to receive the engagement mechanism and a mesh wall connected to the peripheral wall.

5. The fan housing mounting assembly of claim 4, wherein the mesh wall of the housing has a second pattern of openings formed therein that are offset from the first pattern of openings of the mesh plate.

6. The fan housing mounting assembly of claim 5, wherein the mesh plate, when in the second position, is configured with the mesh wall of the housing to block airflow.

7. The fan housing mounting assembly of claim 1, wherein the engagement mechanism includes a U-shaped bracket pivotally connected to the housing.

8. The fan housing mounting assembly of claim 1, wherein the fan module includes a fan module housing.

9. The fan housing mounting assembly of claim 8, wherein the engagement mechanism is sized and configured to receive and support the fan module housing of the fan module.

10. The fan housing mounting assembly of claim 8, wherein the fan module housing is configured to be releasably secured by a threaded fastener to the engagement mechanism.

11. The fan housing mounting assembly of claim 1, wherein the mesh plate is configured to move to the second position during an arc flash incident.

12. The fan housing mounting assembly of claim 1, wherein
the mesh plate includes a first pattern of openings to enable air generated by the fan module to flow through the first pattern of openings,
the housing includes a peripheral wall sized to receive the engagement bracket and a mesh wall connected to the peripheral wall, and
the mesh wall of the housing has a second pattern of openings formed therein that are offset from the first pattern of openings of the mesh plate.

13. The fan housing mounting assembly of claim 12, wherein the mesh plate, when in the second position, is configured with the mesh wall of the housing to block airflow.

14. A method of assembling a fan housing mounting assembly configured to contain energy from arc flash within a mounting slot of an equipment rack, the method comprising:
securing a housing to an enclosure;
pivotally securing an engagement mechanism to the housing within an interior of the housing;
positioning a fan module in the engagement mechanism;
coupling a mesh plate to the engagement mechanism, the mesh plate being configured to move with respect to the housing between a first position in which the mesh plate is spaced from the housing and a second position in which the mesh plate is adjacent to the housing; and
positioning a spring to engage the engagement mechanism, wherein the spring is configured to bias the engagement mechanism to pivot with respect to the housing to present the fan module for removal, and wherein, when the engagement mechanism is pivoted with respect to the housing, the mesh plate is maintained in the second position.

15. The method of claim 14, wherein coupling the mesh plate to the housing and the engagement mechanism includes a plurality of prongs configured to releasably engage the engagement mechanism.

16. The method of claim 14, wherein the mesh plate includes a first pattern of openings to enable air generated by the fan module to flow through the first pattern of openings.

17. The method of claim 16, wherein the housing includes a peripheral wall sized to receive the engagement mechanism and a mesh wall connected to the peripheral wall.

18. The method of claim 17, wherein the mesh wall of the housing having a second pattern of openings formed therein that are offset from the first pattern of openings of the mesh plate, the mesh plate, when in the second position, being configured with the mesh wall of the housing to block airflow.

19. The method of claim 14, wherein the engagement mechanism includes a U-shaped bracket pivotally connected to the housing.

20. The method of claim 14, wherein the engagement mechanism includes a threaded receptacle configured to receive a threaded fastener to secure a fan module housing of the fan module.

21. The method of claim 14, wherein the fan module includes a fan module housing.

22. The method of claim 21, wherein the engagement mechanism is sized and configured to receive and support the fan module housing of the fan module.

23. The method of claim 14, wherein the mesh plate is configured to move to the second position during an arc flash incident.

24. A fan housing mounting assembly, comprising:
an engagement bracket configured to support a fan module;
a housing configured to support the engagement bracket, the engagement bracket being pivotally connected to the housing;
a mesh plate including at least one connector coupled to the engagement bracket, the mesh plate being configured to move with respect to the housing between a first position in which the mesh plate is spaced from the housing and a second position in which the mesh plate is adjacent to the housing; and
a spring configured to engage the engagement bracket,
wherein the spring is configured to bias the engagement bracket to pivot with respect to the housing to present the fan module for removal, and
wherein, when the engagement bracket is pivoted with respect to the housing, the mesh plate is maintained in the second position.

25. The fan housing mounting assembly of claim 24, wherein the engagement bracket includes a U-shaped bracket pivotally connected to the housing.

26. The fan housing mounting assembly of claim 24, wherein the engagement bracket is sized and configured to receive and support a fan module housing of the fan module.

27. The fan housing mounting assembly of claim 26, wherein the fan module housing is configured to be releasably secured by a threaded fastener to the engagement bracket.

* * * * *